United States Patent
Coffy

(10) Patent No.: US 10,886,210 B2
(45) Date of Patent: Jan. 5, 2021

(54) COVER FOR AN ELECTRONIC DEVICE AND METHOD OF FABRICATION

(71) Applicant: STMicroelectronics (Grenoble 2) SAS, Grenoble (FR)

(72) Inventor: Romain Coffy, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/365,063

(22) Filed: Mar. 26, 2019

(65) Prior Publication Data

US 2019/0304891 A1    Oct. 3, 2019

(30) Foreign Application Priority Data

Mar. 29, 2018    (FR) ..................... 18 52713

(51) Int. Cl.
*H01L 23/498* (2006.01)
*H01L 21/50* (2006.01)
(Continued)

(52) U.S. Cl.
CPC ........ *H01L 23/49838* (2013.01); *H01L 21/50* (2013.01); *H01L 23/10* (2013.01); *H01L 23/3114* (2013.01); *H01L 23/3121* (2013.01); *H01L 23/58* (2013.01); *H01L 24/48* (2013.01); *H01L 24/97* (2013.01); *H01L 31/0203* (2013.01); *H05K 5/0208* (2013.01);
(Continued)

(58) Field of Classification Search
CPC ......... H01L 33/486; H01L 2924/12041; H01L 24/48; H01L 21/56; H01L 23/3114
See application file for complete search history.

(56) References Cited

U.S. PATENT DOCUMENTS 5,389,738 A    2/1995    Piosenka et al.
6,567,435 B1 *  5/2003    Scott ..................... G02B 6/4201
                                            257/729
(Continued)

FOREIGN PATENT DOCUMENTS

EP    0128672 A1    12/1984
EP    0860882 A2    8/1998
(Continued)

OTHER PUBLICATIONS

INPI Search Report and Written Opinion for FR 1852713 dated Dec. 18, 2018 (11 pages).

*Primary Examiner* — Caridad Everhart
(74) *Attorney, Agent, or Firm* — Crowe & Dunlevy

(57) ABSTRACT

A cover for an electronic device includes a support body having a through-passage. An optical element which allows light to pass is mounted on said support body in a position extending across the through-passage. A surface of the optical element includes an electrically-conducting track configured as a security detection element. At least two electrical connection leads are rigidly attached to the support body and include first uncovered portions internal to the support body and electrically connected to spaced apart locations on the electrically-conducting track. The at least two electrical connection leads further including second uncovered portions external to said support body. The cover is mounted on a support plate carrying an electronic chip situated in the through-passage at a distance from the optical element.

19 Claims, 2 Drawing Sheets

(51) Int. Cl.
*H01L 31/0203* (2014.01)
*H01L 23/10* (2006.01)
*H01L 23/31* (2006.01)
*H01L 23/00* (2006.01)
*H01L 23/58* (2006.01)
*H05K 5/02* (2006.01)

(52) U.S. Cl.
CPC .............. *H01L 2224/48091* (2013.01); *H01L 2224/48227* (2013.01)

(56) References Cited

U.S. PATENT DOCUMENTS

| | | | |
|---|---|---|---|
| 6,587,481 B1 * | 7/2003 | Seong .................... | G11B 7/127 372/101 |
| 2019/0199052 A1 * | 6/2019 | Miyoshi .............. | H01S 5/02296 |

FOREIGN PATENT DOCUMENTS

| | | | |
|---|---|---|---|
| FR | 2824953 | A1 | 11/2002 |
| FR | 2864667 | A1 | 7/2005 |
| JP | S63237144 | A | 10/1988 |
| JP | 2009206217 | A | 9/2009 |
| WO | 2005109552 | A2 | 11/2005 |

\* cited by examiner

COVER FOR AN ELECTRONIC DEVICE AND METHOD OF FABRICATION

PRIORITY CLAIM

This application claims the priority benefit of French Application for Patent No. 1852713, filed on Mar. 29, 2018, the content of which is hereby incorporated by reference in its entirety to the maximum extent allowable by law.

TECHNICAL FIELD

The present invention relates to the field of microelectronics and more particularly relates to covers for electronic devices and to electronic devices.

SUMMARY

In an embodiment, a cover for an electronic device comprises: a support body having a through-passage and an optical element allowing light to pass, mounted on said support body across said passage and having at least one track made of an electrically-conductive material, in which at least two electrical connection leads are rigidly attached to said body and comprise, respectively, on the one hand, internal uncovered portions connected to said conducting track, at spaced out locations, and on the other hand, uncovered portions external to said support body.

Thus, the electrically-conductive line comprising the electrical connection leads and the conducting tracks is able to be broken and hence interrupted in the case of deterioration, intentional or unintentional, of the support body and/or of the optical element and hence forms a simple element of security or safety for detecting said deterioration.

Said internal portions of the electrical connection leads may be situated in said through-passage, said electrical connection leads having intermediate portions joining said internal and external portions and passing through one wall of said support body.

Said electrical connection leads may be situated on two opposing sides of said support body.

Said support body may have a shoulder formed in said through-passage, at a distance from one end face of said support body, where a peripheral part of one face of the optical element may be situated facing this shoulder.

Said shoulder may have a strengthening rib, where said optical element may be resting on this rib.

The internal portions of the electrical connection leads may be situated above said the shoulder and said faces of the optical element may be equipped with said conducting track, where electrical link bumps may be interposed between the end spaced out regions of said conducting tracks and said internal portions of said electrical connection leads.

The electrical connection leads may have terminal parts situated substantially in the plane of one end face of the support body.

In an embodiment, an electronic device comprises: a support plate including an integrated network of electrical connections, at least one electronic chip mounted on a front face of the support plate, and an encapsulation cover such as defined hereinabove, mounted above said front face of the plate in a position such that the chip is situated in the through-passage of the cover and the optical element is situated in front of the chip, in which electrical link bumps are interposed between the external portions of the electrical connection leads and front lugs of the network of electrical connections of the support plate.

The support body of the cover may be placed on the front face of the support plate.

A layer of adhesive may be interposed between the support body and the support plate.

The chip may be equipped with an emitter of light.

The network of electrical connections of the support plate may comprise an electrical power supply line for the chip, including the electrical connecting lugs for said electrical connection leads of the cover.

In an embodiment, a method for fabrication of a cover for an electronic device, such as defined hereinabove, comprises the following steps: placing at least two leads in a mold comprising two parts bounding between them an imprint corresponding to the support body to be obtained, injecting a coating material into said imprint, such that the injected material forms an over-molded support body, removing the over-molded support body from the mold, and mounting the optical element on the over-molded support body.

BRIEF DESCRIPTION OF THE DRAWINGS

A cover, an electronic device comprising this cover and a mode of fabrication of a cover will now be described by way of non-limiting examples, illustrated by the appended drawings in which.

DETAILED DESCRIPTION

Figure 1:
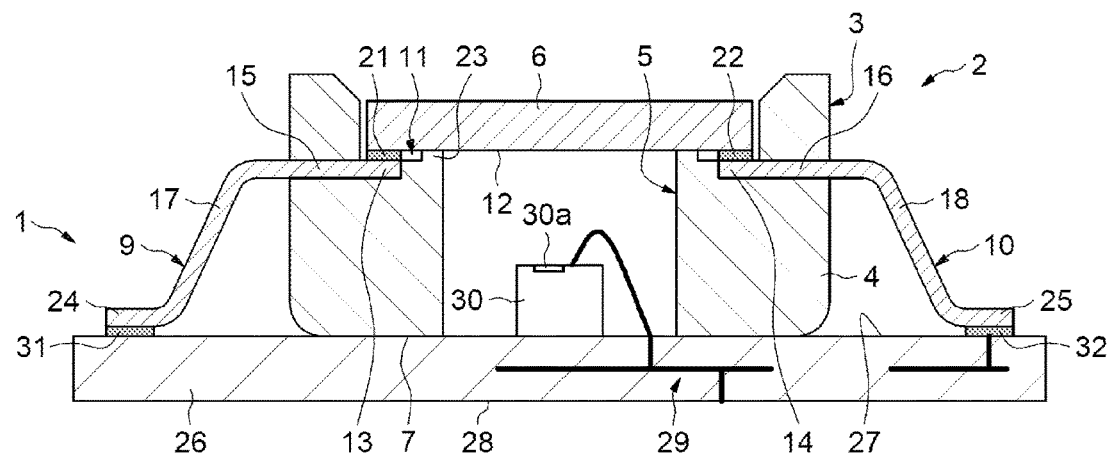
FIG. 1 shows a cross-section of an electronic device.
Figure 2:
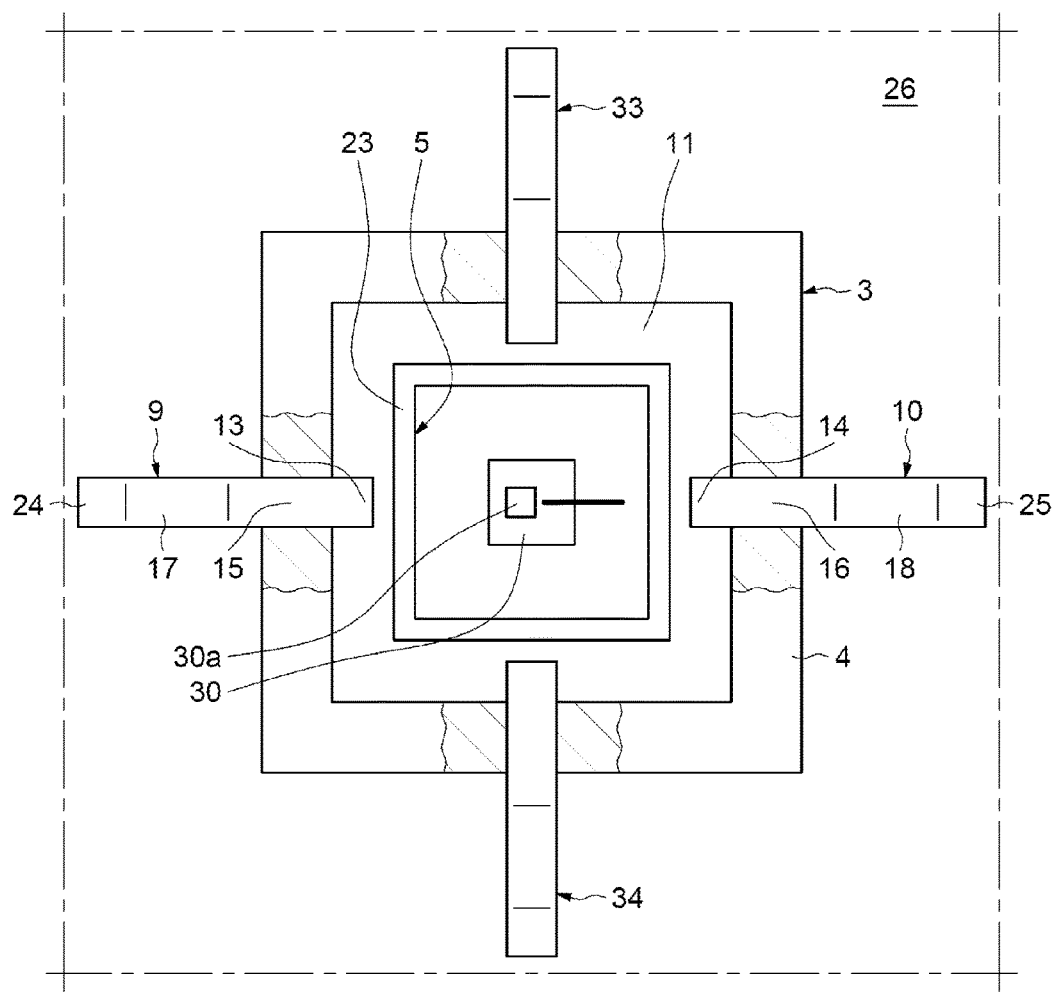
FIG. 2 shows a top view of the electronic device in FIG. 1, without an optical element and, in part, as a cross-section.
Figure 3:
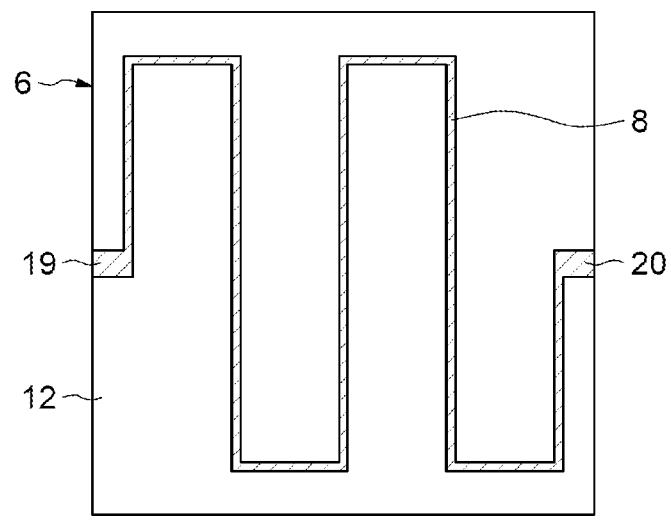
FIG. 3 shows a front view of an optical element.

In FIGS. 1, 2 and 3, an electronic device 1 is illustrated which comprises a cover 2.

The cover 2 comprises a support body 3 made of a dielectric material, for example a photoresist, which has a peripheral wall 4 bounding an axial through-passage 5 which extends between the back face and the front face of the peripheral wall 4. The peripheral wall 4 may take the form of a ring, for example square or rectangular in shape.

The cover 2 further comprises an optical element 6 allowing light to pass, for example in the form of a plate made of a dielectric material, which is mounted on the support body 2 at the front face and extending across the through-passage 5, at a distance from the back face (end) 7 of the peripheral wall 4. The optical element 6 includes a track 8 that is made of an electrically-conductive material positioned on the face 12 which faces front face of the support body 2. The optical element 6 may be made of glass.

The cover 2 comprises two electrical connection leads 9 and 10, for example made of metal, which are rigidly attached to, and further pass through, the support body 3 and which, respectively, comprise, on the one hand, internal uncovered portions 13, 14 connected to the conducting tracks 8, at spaced out locations, and on the other hand, uncovered portions 17, 18 external to the support body 3, in such a manner that the track 8 and the leads 9 and 10 establish a breakable electrically-conductive line.

According to the example shown, the support body 3 has an internal shoulder 11, in the through-passage 5, situated at a distance from the end face 7 and oriented for example towards the front.

A peripheral part of the back face 12 of the optical element 6 is facing the shoulder 11 axially.

The back face 12 of the optical element 6 has the conducting track 8, which for example takes the form of a serpentine.

The electrical connection leads 9 and 10 are, for example, disposed on opposing locations of the peripheral wall 4.

The electrical connection leads 9 and 10 have, respectively, the internal portions 13 and 14 which are situated in said passage on the shoulder 11, intermediate portions 15 and 16 which pass through the peripheral wall 4 of the support body 3 and are buried and external portions 17 and 18 which are situated outside of the support body 3 and extend laterally to the peripheral wall 4 of the support body 3.

The internal portions 13 and 14 of the electrical connection leads 9 and 10 are facing electrical connection areas 19 and 20 of the conducting tracks 8 (FIG. 3).

Electrical link bumps 21 and 22 are interposed between the end spaced out regions 19 and 20 of the conducting tracks 8 and the internal portions 13 and 14 of the electrical connection leads 9 and 10. The electrical link bumps 21 and 22 may be formed by dots of an electrically-conductive adhesive or globs of solder.

Optionally, the shoulder 11 has a raised reinforcement rib 23 on which the back face 12 of the optical element 6 is resting.

Since the electrical connection leads 9 and 10 are relatively rigid, the electrical link bumps 21 and 22 can at the same time provide the attachment of the optical element 6 onto the support body 3. Nevertheless, non-electrically-conductive adhesive may be interposed between the optical element 6 and the annular shoulder 11 at other locations.

The external portions 17 and 18 of the electrical connection leads 9 and 10 are folded back so as to have terminal parts 24 and 25 which are situated approximately in the plane of the end back face 7 of the peripheral wall 4 of the support body 3.

The electronic device 1 comprises a support plate 26 which has a front face 27 and a back face 28 and which comprises an integrated network of electrical connections 29, from one face to the other.

The electronic device 1 comprises an electronic chip 30 mounted on the front face 25 of the support plate 26 and connected to the integrated network of electrical connections 29, for example by wires and/or direct contacts.

The cover 2 is mounted on the front face 27 of the support plate 26 in such a manner as to cover the chip 30 at a distance, in a position such that the back face 7 of the support body 3 is above the front face 27 of the support plate 26, resting against it or at a short distance from it, and that the optical element 6 is situated at a distance above the chip 30.

Electrical link bumps 31 and 32 are interposed between the terminal parts 24 and 25 of the external portions 17 and 18 of the electrical connection leads 9 and 10 and front lugs of the network of electrical connections 29 of the support plate 26. The electrical link bumps 31 and 32 are formed by dots of an electrically-conductive adhesive or globs of solder.

The cover 2 may be fixed to the support plate 26 solely by the electrical link bumps 31 and 32. Nevertheless, a ribbon of adhesive may be interposed between the back face 7 of the support body 3 and the front face 27 of the support plate 26.

Furthermore, the cover 2 may comprise opposing complementary attachment leads 33 and 34 rigidly attached to the support body 3, situated at other locations on the periphery of the support body 3. These leads may also be included in an electrically-conductive line. The complementary leads 33 and 34 are shown in FIG. 2 as being situated on the other two opposing sides of the peripheral wall 4 of the support body 3. Nevertheless, the complementary leads 33 and 34 could be situated on the same sides of the peripheral wall 4 of the support body 3 as the electrical connection leads 9 and 10.

The chip 30 comprises an emitter of light 30a in its front face. The light emitted passes through the optical element 6, the latter being, for example, arranged so as to form a diffuser of light towards the outside. The conducting track 8 is narrow enough not to have an effect on the light passing through the optical element 6.

The breakable continuous electrical line, formed by the track 8, the electrical links 21 and 22 and the electrical links 31 and 32 and the electrical connection leads 9 and 10, may, for example, be included in an electrical power supply line of the chip 30 of the network of electrical connections 29, such that, if this continuous electrical line is broken at any given location, the power supply to the chip 30 is immediately cut and the chip 30 no longer operates.

This may be the case, for example, if the cover 2 is torn from the support plate 26, if the optical element 6 is torn from the support body 3, if the support body 3 and/or the optical element are broken.

Thus, if the aforementioned continuous electrical line is broken, the emitter of light 30a of the chip 30 is immediately extinguished and any risk of dazzling a user is avoided.

One mode of fabrication of the cover 3 will now be described.

Figure 4:
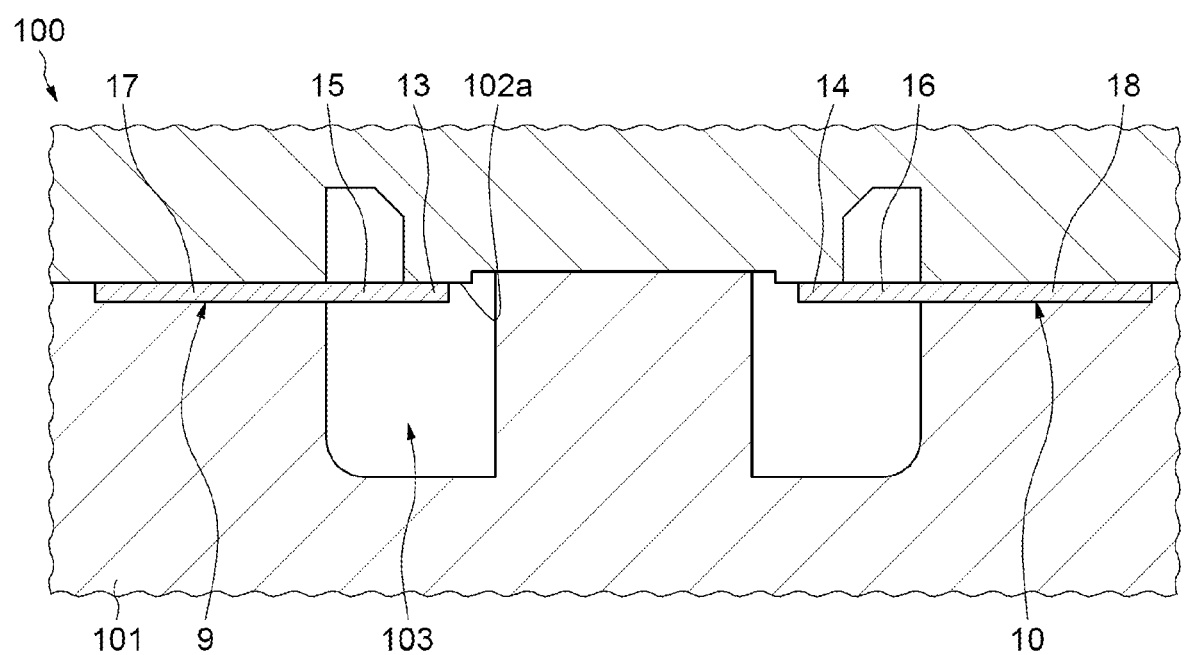
FIG. 4 shows a cross-section of a mold for the fabrication of a cover.

As illustrated in FIG. 4, a mold 100 is used comprising a lower part 101 and an upper part 102, which, joined together, bound between them an imprint (or cavity) 103 whose shape corresponds to the support body 3.

The electrical connection leads 9 and 10, in an elongated state, are placed in the mold 100 in such a manner that their internal portions 13 and 14 are in contact with a surface 102a of the upper part 102 of the mold 100, corresponding to the shoulder 11 to be formed, that their external portions 17 and 18 are held or clamped between the lower part 101 and the upper part 102 of the mold 100, on the periphery of the imprint 103, and that their intermediate portions 15 and 16 pass through an annular part of the imprint 103, between the surfaces 102a and the periphery of the imprint 103, and are free.

Subsequently, a coating material is injected into the imprint 103, such that the support body 3 is over-molded onto the intermediate portions 15 and 16 of the electrical connection leads 9 and 10 and that the internal portions 13 and 14 are integrated into the surfaces of the shoulder 11.

After removing from the mold, the external portions 17 and 18 of the electrical connection leads 9 and 10 are formed, in such a manner that the terminal parts 24 and 25 extend, as previously described, approximately in the plane of the end back face 7 of the peripheral wall 4 of the support body 3.

Then, the optical element 6 is coupled to the support body 3 obtained, by means of the electrical link bumps 21 and 22.

According to one variant embodiment, the leads 9 and 10 could be pre-formed before being placed in the mold 100, the parts of the mold 100 being adapted as a consequence.

According to one variant embodiment, the external portions 17 and 18 of the leads 9 and 10 could be against the external face of the support body 3, where the terminal parts 24 and 25 may be folded back towards the outside or towards the inside against the back face 7 of the support body 3. In this case, the leads 9 and 10 could be placed entirely within the imprint 103 of the mold 100.

The invention claimed is:

1. A cover for an electronic device, comprising:
   a support body having a through-passage;
   an optical element allowing light to pass, said optical element mounted on said support body extending across said through-passage;
   at least one track made of an electrically-conductive material which is mounted to said optical element, said at least one track forming a security element configured for detection of deterioration of one or more of the support body and optical element; and
   at least two electrical connection leads which pass through a wall of said support body and which, respectively, comprise: first uncovered portions which are electrically connected to two spaced apart locations of said at least one track; and second uncovered portions external to said support body.

2. The cover according to claim 1, wherein said first uncovered portions of the at least two electrical connection leads are situated in said through-passage.

3. The cover according to claim 2, wherein the second uncovered portions of the at least two electrical connection leads are situated on two opposing sides of said support body.

4. A cover for an electronic device, comprising:
   a support body having a through-passage;
   an optical element allowing light to pass, said optical element mounted on said support body extending across said through-passage;
   at least one track made of an electrically-conductive material which is mounted to said optical element, said at least one track forming a security element configured for detection of deterioration of one or more of the support body and optical element; and
   at least two electrical connection leads which are rigidly attached to said support body and which, respectively, comprise: first uncovered portions which are electrically connected to two spaced apart locations of said at least one track; and second uncovered portions external to said support body;
   wherein said support body further includes a shoulder formed in said through-passage, and wherein a peripheral part of a face of the optical element is situated facing the shoulder.

5. The cover according to claim 4, wherein said shoulder comprises a reinforcement rib, and wherein the peripheral part of the face of the optical element is situated facing and resting on the reinforcement rib.

6. The cover according to claim 4, wherein the first uncovered portions of the at least two electrical connection leads are positioned above the shoulder and said face of the optical element has said conducting track, further comprising: electrical link bumps being interposed between the two spaced apart locations of said at least one track and said first uncovered portions of said at least two electrical connection leads.

7. The cover according to claim 1, wherein the at least two electrical connection leads have terminal parts situated substantially in a plane of an end face of the support body.

8. An electronic device, comprising:
   a support plate including an integrated network of electrical connections;
   at least one electronic chip mounted on a front face of the support plate; and
   an encapsulation cover, comprising:
      a support body having a through-passage,
      an optical element allowing light to pass, said optical element mounted on said support body extending across said through-passage,
      at least one track made of an electrically-conductive material which is mounted to said optical element, said at least one track forming a security element configured for detection of deterioration of one or more of the support body and optical element, and
      at least two electrical connection leads which are rigidly attached to said support body and which, respectively, comprise: first uncovered portions which are electrically connected to two spaced apart locations of said at least one track; and second uncovered portions external to said support body;
   wherein the encapsulation cover is mounted above said front face of the plate in a position such that the electronic chip is situated in the through-passage of the encapsulation cover and the optical element is situated in front of the electronic chip; and
   electrical link bumps being interposed between the external portions of the electrical connection leads and front lugs of the network of electrical connections of the support plate.

9. The device according to claim 8, wherein the support body of the cover is placed on the front face of the support plate.

10. The device according to claim 8, wherein a layer of adhesive is interposed between the support body and the support plate.

11. The device according to claim 8, wherein the electronic chip includes an emitter of light.

12. The device according to claim 8, wherein the network of electrical connections of the support plate comprises an electrical power supply line for the electronic chip including the electrical connection lugs of said electrical connection leads of the cover.

13. A method of fabrication of a cover for an electronic device, comprising:
   placing at least two leads in a mold comprising two parts bounding between them a cavity corresponding to a shape of a support body to be obtained,
   injecting a coating material into said cavity, such that the injected material forms an over-molded support body having a wall through which the two leads pass,
   removing the over-molded support body from the mold, and
   mounting an optical element on the support body obtained, said optical element including at least one track made of an electrically-conductive material, said at least one track forming a security element configured for detection of deterioration of one or more of the support body and optical element, wherein mounting comprises electrically connecting uncovered portions of the two leads to two spaced apart locations of said at least one track.

14. A cover for an electronic device, comprising:
   a support body having a through-passage;
   an optical element allowing light to pass, said optical element mounted on said support body extending across said through-passage;
   at least one track made of an electrically-conductive material which is mounted to said optical element, said at least one track forming a security element configured for detection of deterioration of one or more of the support body and optical element; and
   at least two electrical connection leads which are rigidly attached to said support body and which, respectively, comprise: first uncovered portions which are situated in said through-passage and electrically connected to two spaced apart locations of said at least one track; second uncovered portions external to said support body; and intermediate portions which join said first and second uncovered portions, said intermediate portions passing through a wall of said support body.

15. The cover according to claim 14, wherein the second uncovered portions of the at least two electrical connection leads are situated on two opposing sides of said support body.

16. The cover according to claim 14, wherein the at least two electrical connection leads have terminal parts situated substantially in a plane of an end face of the support body.

17. A cover for an electronic device, comprising:
a support body having a through-passage;
an optical element allowing light to pass, said optical element mounted on said support body extending across said through-passage;
at least one track made of an electrically-conductive material which is mounted to said optical element, said at least one track forming a security element configured for detection of deterioration of one or more of the support body and optical element; and
at least two electrical connection leads which are rigidly attached to said support body and which, respectively, comprise: first uncovered portions which are electrically connected to two spaced apart locations of said at least one track; and second uncovered portions external to said support body, wherein the second uncovered portions of the at least two electrical connection leads are situated on two opposing sides of said support body.

18. The cover according to claim 17, wherein the at least two electrical connection leads have terminal parts situated substantially in a plane of an end face of the support body.

19. A cover for an electronic device, comprising:
a support body having a through-passage;
an optical element allowing light to pass, said optical element mounted on said support body extending across said through-passage;
at least one track made of an electrically-conductive material which is mounted to said optical element, said at least one track forming a security element configured for detection of deterioration of one or more of the support body and optical element; and
at least two electrical connection leads which are rigidly attached to said support body and which, respectively, comprise: first uncovered portions which are electrically connected to two spaced apart locations of said at least one track; and second uncovered portions external to said support body, wherein the at least two electrical connection leads have terminal parts situated substantially in a plane of an end face of the support body.

* * * * *